United States Patent [19]
Wong

[11] Patent Number: 5,425,074
[45] Date of Patent: Jun. 13, 1995

[54] FAST PROGRAMMABLE/RESETTABLE CMOS JOHNSON COUNTERS

[75] Inventor: Keng L. Wong, Portland, Oreg.

[73] Assignee: Intel Corporation, Santa Clara, Calif.

[21] Appl. No.: 169,607

[22] Filed: Dec. 17, 1993

[51] Int. Cl.⁶ ............................................. H03K 21/00
[52] U.S. Cl. ................................................ 377/47
[58] Field of Search .......................................... 377/47

[56] References Cited

U.S. PATENT DOCUMENTS

| | | | |
|---|---|---|---|
| 4,851,783 | 7/1989 | Räbinger | 377/47 |
| 4,856,032 | 8/1989 | Klekotka et al. | 377/47 |
| 4,972,362 | 11/1990 | Elkind et al. | 364/760 |

FOREIGN PATENT DOCUMENTS 0284520 11/1990 Japan ................................. 377/47

*Primary Examiner*—Margaret Rose Wambach
*Attorney, Agent, or Firm*—Blakely, Sokoloff, Taylor & Zafman

[57] ABSTRACT

An integrated circuit for frequency synthesis within a microprocessor. The integrated circuit includes at least one of n-bit Johnson counter being clocked by a clock internal to the microprocessor. The n-bit Johnson counter being coupled to odd-even logic which generates "2n−1" outputs having "even" and "odd" divide values. The odd-even logic is coupled to a multiplexor which is selected to pass a selected output to be fed back into the n-bit Johnson counter.

36 Claims, 10 Drawing Sheets

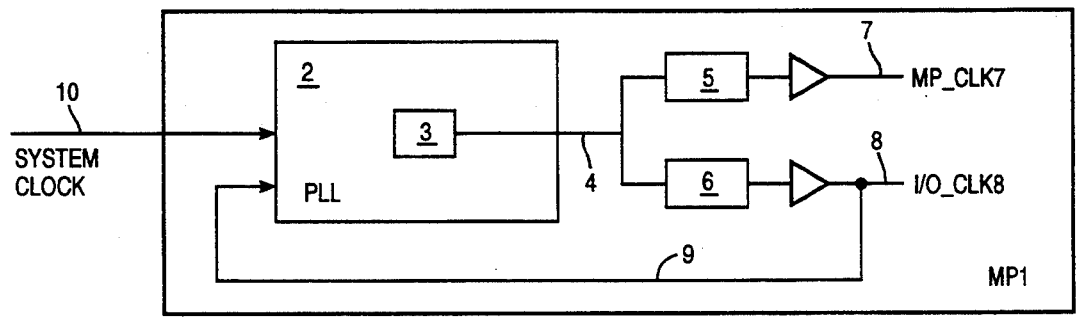
FIG_1
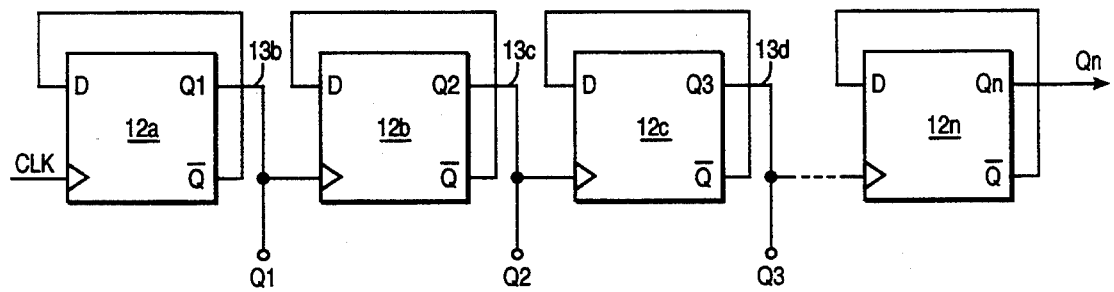
FIG_2A (PRIOR ART)
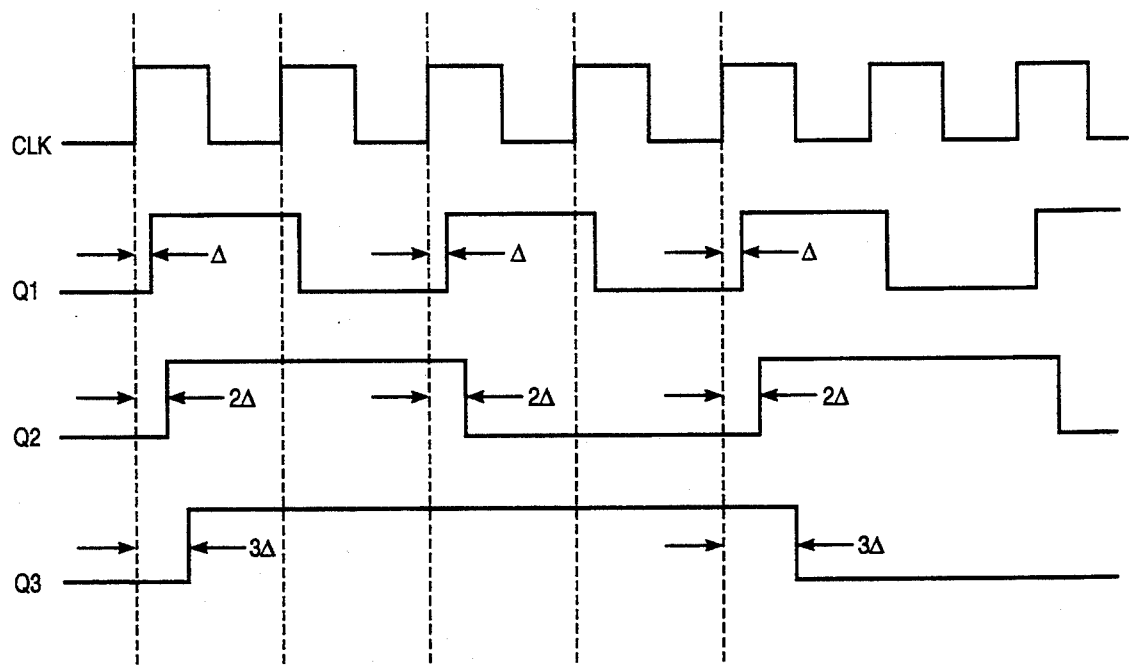
FIG_2B (PRIOR ART)

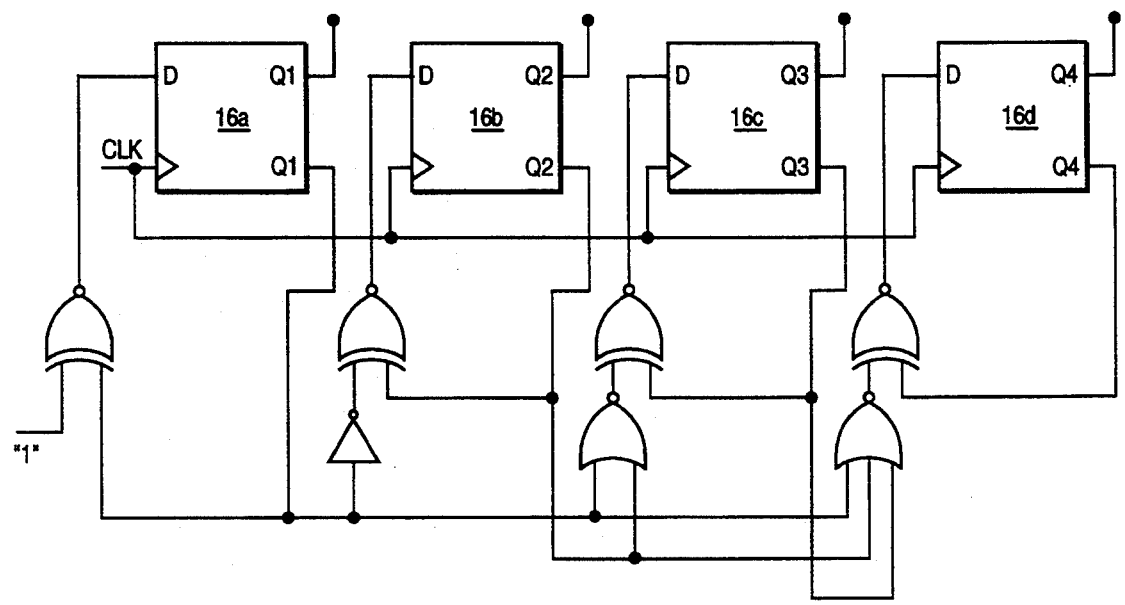
FIG_3A (PRIOR ART)
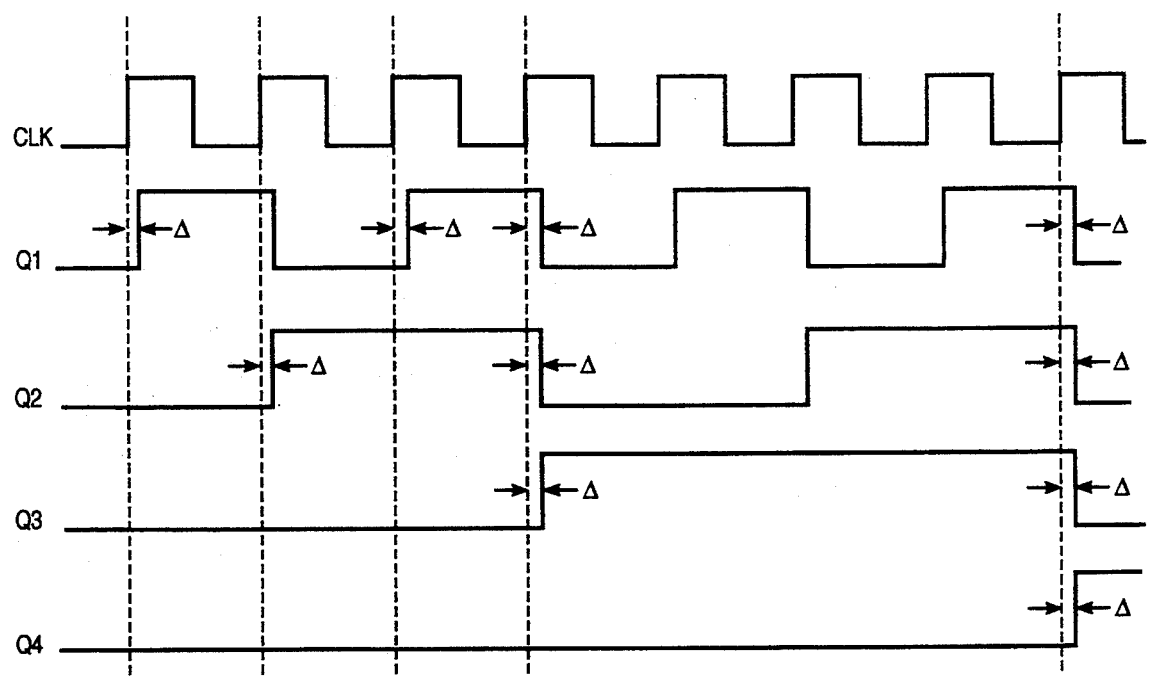
FIG_3B (PRIOR ART)

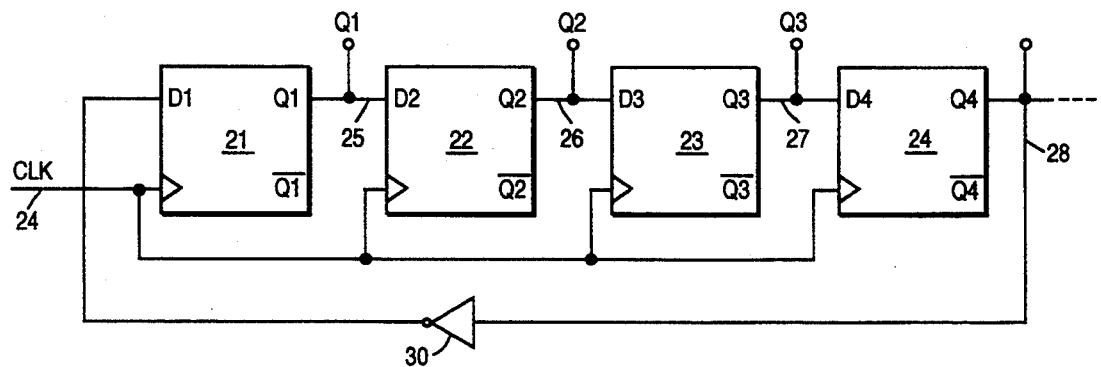
FIG_4A (PRIOR ART)
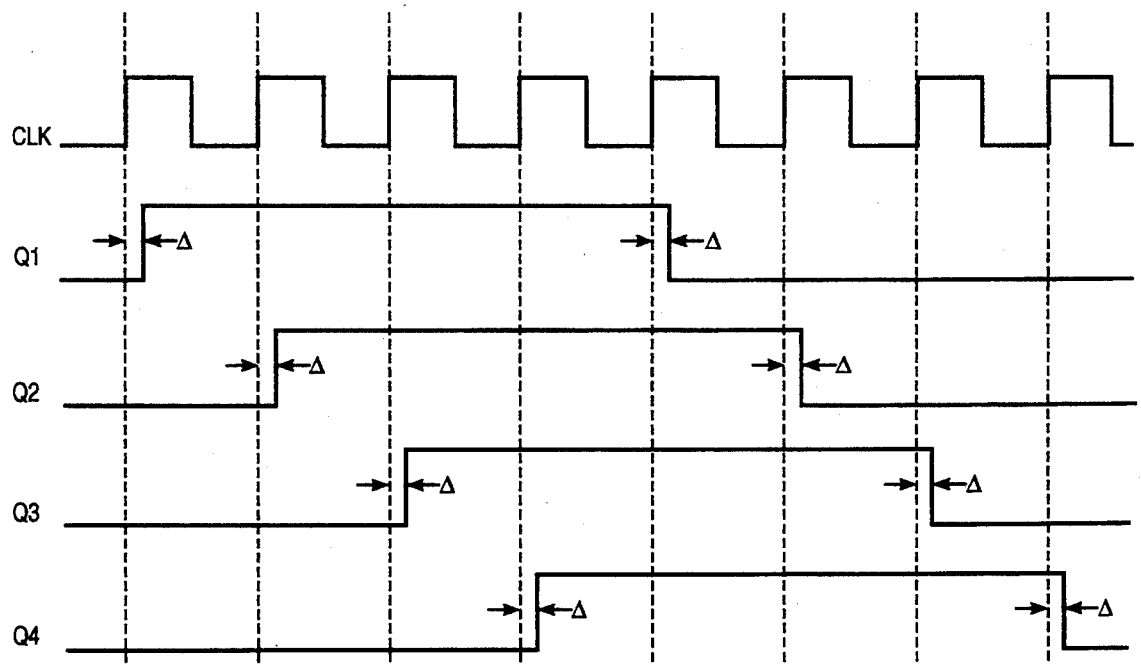
FIG_4B (PRIOR ART)

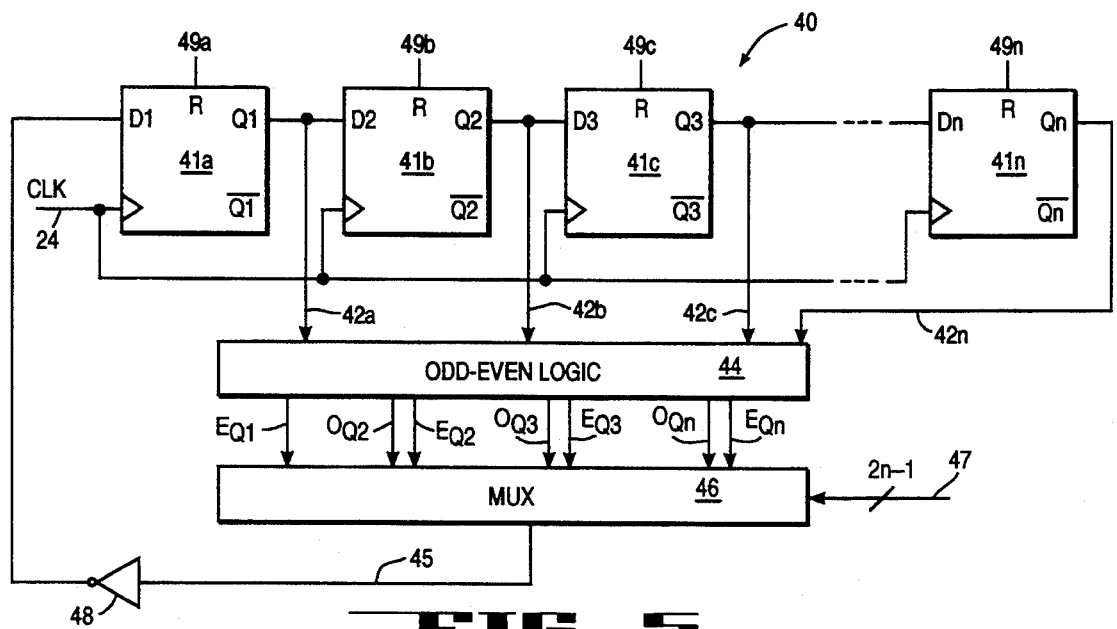
FIG_6
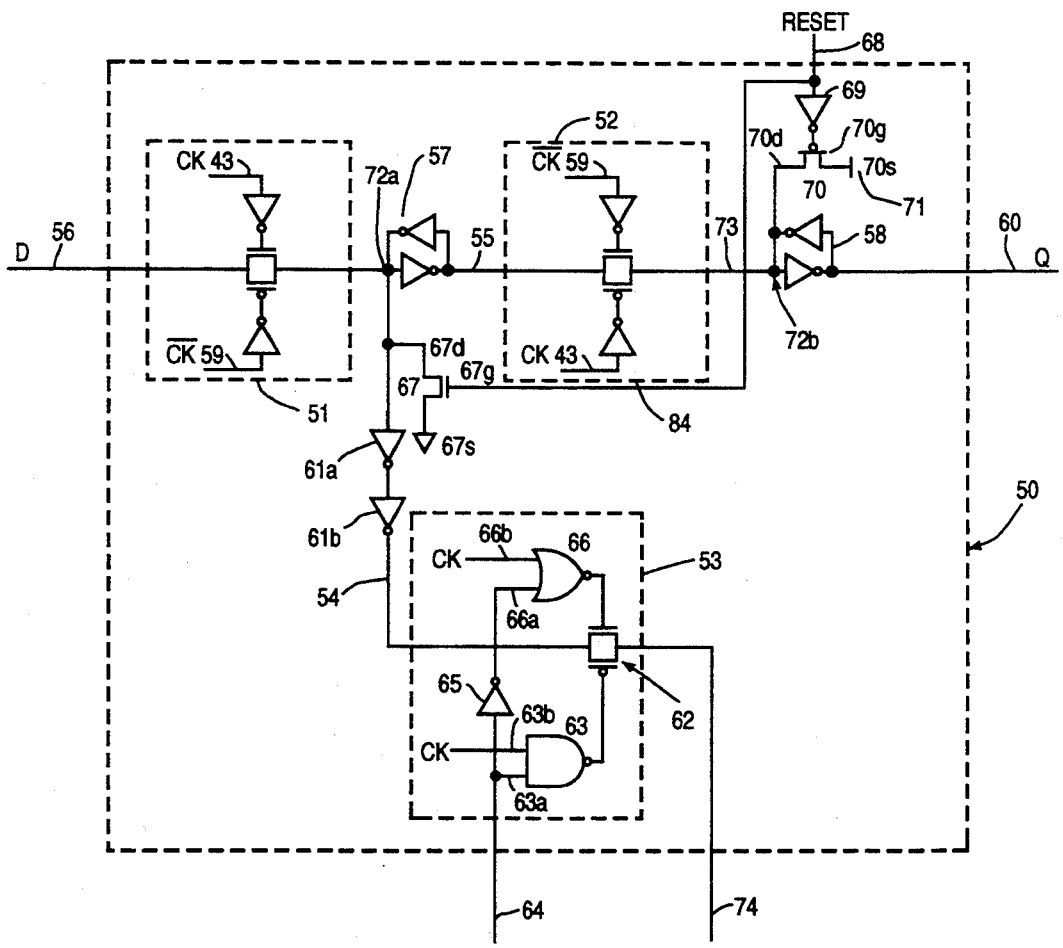
FIG_6

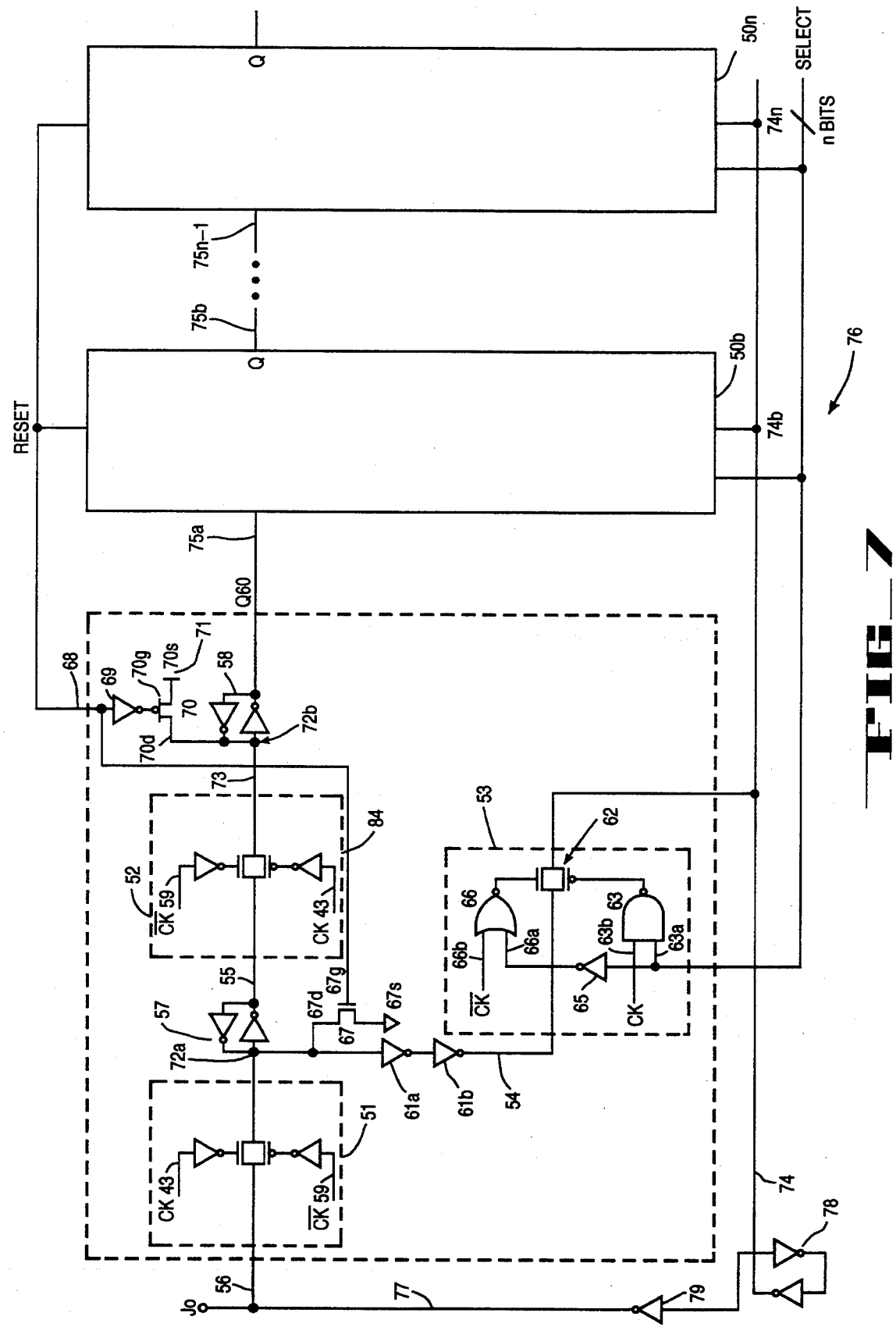
FIG_7

FIG_9

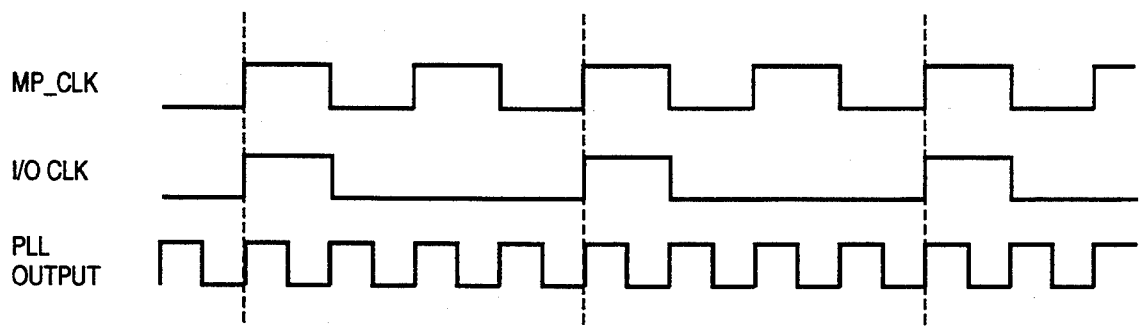
FIG_11A
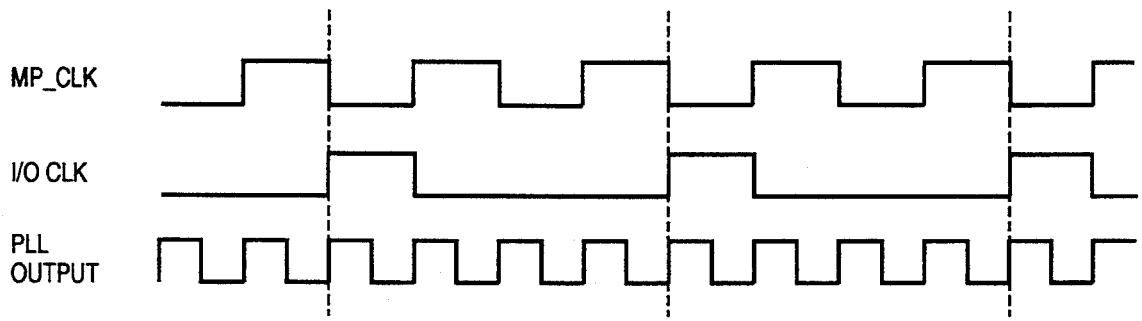
FIG_11B
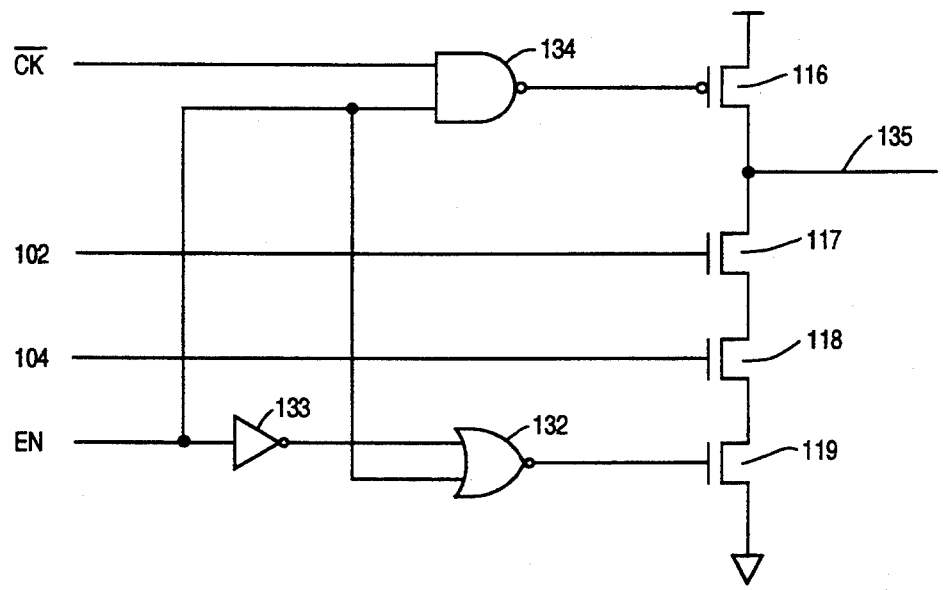
FIG_12

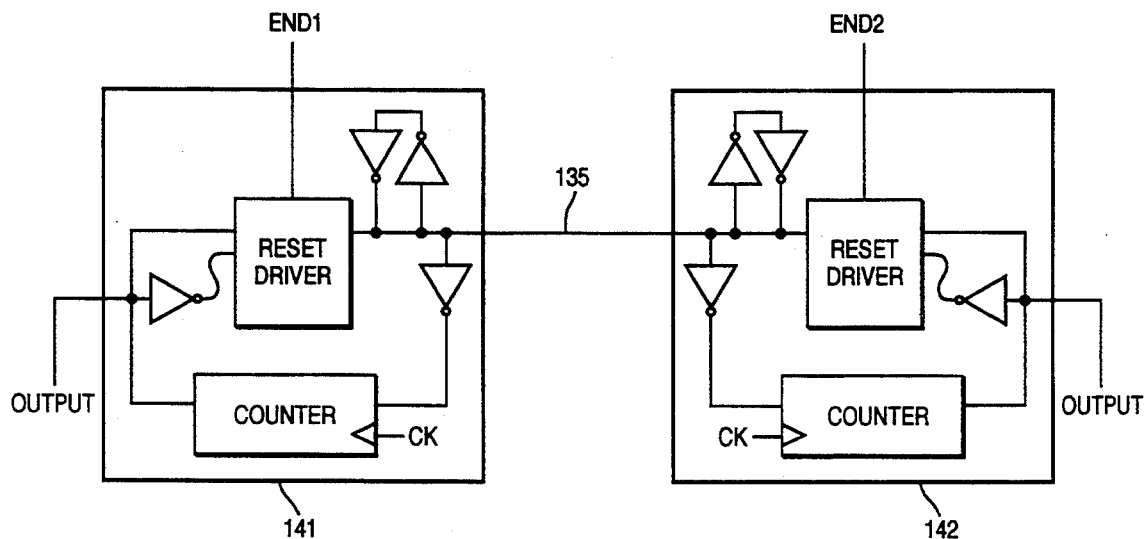
FIG_13
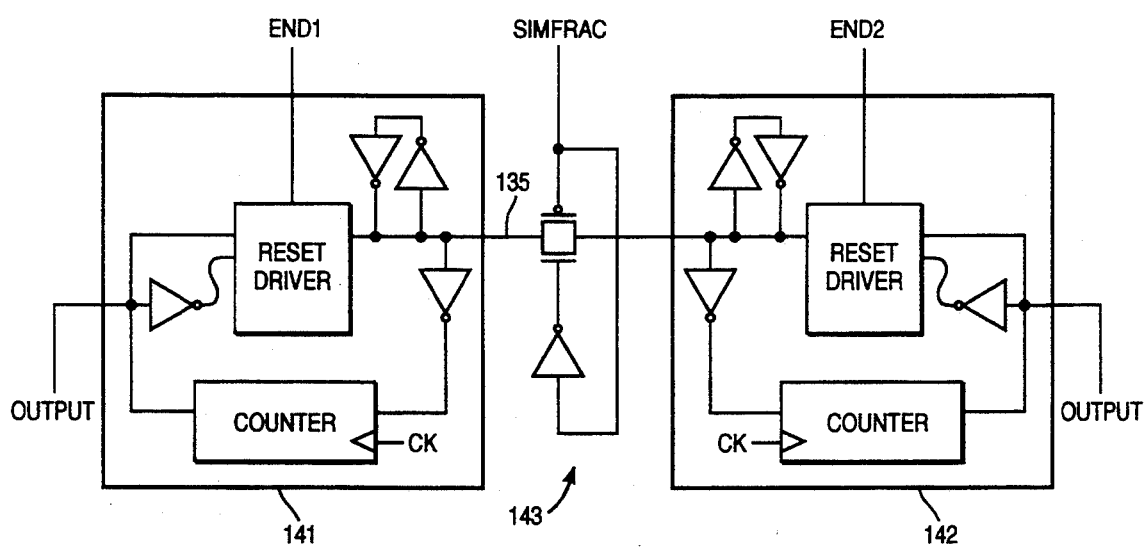
FIG_14

FAST PROGRAMMABLE/RESETTABLE CMOS JOHNSON COUNTERS

BACKGROUND OF THE INVENTION

1. Field of the Invention

The present invention relates to an integrated circuit and method for frequency synthesis and clock generation. More specifically, the present invention relates to a programmable, and preferably, self-resetting Johnson counter incorporated within a dynamic feedback loop for frequency synthesis of an internal clock.

2. Background of the Field

It is common knowledge that a microprocessor internally operates at a clock frequency substantially greater than a clocking frequency of a system clock external to the microprocessor ("the external system clock"). In fact, in recent years, microprocessor internal clock frequencies have increased disproportionately with respect to external system clock frequencies. As a result, it has become necessary to employ frequency synthesis in order to generate the microprocessor clock as a function of the external system clock. A paramount reason for such frequency synthesis is to enable the microprocessor to perform at its fastest possible frequency while data exchange between the microprocessor and an external board system can proceed at a rate limited by system constraints, such as, signal flight time across board traces, heavy board capacitances and the like.

In order to accomplish frequency synthesis, dynamic feedback loops have been employed within the microprocessor ("MP") 1 as shown in FIG. 1. An example of the dynamic feedback loop includes, but are not limited to, a phase-locked-loop ("PLL"). The PLL 2 is a feedback component including an internal oscillator 3 generating a first frequency which is usually substantially greater than a frequency of a external system clock 10 inputted into the PLL 2. The internal oscillator 3 outputs an oscillator signal having the first frequency through a PLL output signal line 4, which couples a first and second dividers 5 and 6 to the PLL 2. As a result, clock signals within the MP 1, namely an internal microprocessor clock signal ("MP_CLK signal") 7 and an internal I/O clock signal ("I/O_CLK signal") 8, are obtained by inputting the oscillator signal into the first and second dividers 5 and 6 respectively. The I/O_CLK signal 8 is synchronized to the external system clock 10 and is fed back into the PLL 2 via a feedback signal line 9 in order to eliminate skew between the external system clock and the I/O_CLK signal 8. Moreover, in order to eliminate skew between the MP_CLK signal 7 and the I/O_CLK signal 8, the delay through the first and second dividers 5 and 6 must be equal, even though such dividers may be programmed differently.

Although there exist many different types of dividers (e.g., counters) in the marketplace, most of them have extremely slow critical paths and/or are not programmable, preventing easy modification of the dividers to support different system requirements. Circuit designers have commonly used Johnson counters to perform synchronous high frequency synthesis and high speed clock generation. Nevertheless, there does not exist any known method for resetting two Johnson counters to support frequency synthesis. Moreover, in today's technology, there does not exist a suitable method for implementing a Johnson counter in an integrated circuit processed with CMOS technology due to very high frequency demands, often much higher than that of normal logic circuits on the microprocessor.

BRIEF SUMMARY OF THE INVENTION

In light of the foregoing, it is appreciated that there exists a bone fide need for an apparatus and method for frequency synthesis in high speed applications utilizing. Therefore, it is an object of the present invention to provide a Johnson Counter with programmable features.

It is another object of the present invention to provide a Johnson counter incorporating "odd" and "even" divide values.

It is yet another object of the present invention to provide a Johnson counter having a self-resetting mechanism operable at initialization in order to avoid operating in an illegal sequence.

It is another object of the present invention to provide a Johnson counter designed for maximum speed operation in CMOS technology, wherein the operation speed is not limited by the length of the counter.

It is another object of the present invention to provide a plurality of counters with a self-resetting scheme.

These and other objects of the present invention are provided by a counter to be utilized for frequency synthesis of an input clock signal in high speed applications, typically in microprocessors. The counter is programmable through conventional logic gates in combination with a select line. Such programmability may include odd divide values by either incorporating odd-even logic to the counter, or preferably incorporating such logic within the counter.

BRIEF DESCRIPTION OF THE DRAWINGS

FIG. 1 is a block diagram of a frequency synthesizer having two dividers, wherein the frequency synthesizer employs a dynamic feedback loop relationship.

FIG. 2A is a block diagram of a conventional 4-bit ripple counter.

FIG. 2B is a timing diagram illustrating the outputs of each bit slice of the conventional 4-bit ripple counter according to a predetermined clocking frequency.

FIG. 3A is a block diagram of a conventional 4-bit synchronous binary counter.

FIG. 3B is a timing diagram of the outputs of each bit slice of the conventional 4-bit synchronous binary counter.

FIG. 4A is a block diagram of a conventional 4-bit Johnson counter.

FIG. 4B is a timing diagram of the outputs of each flip-flop of the conventional 4-bit Johnson counter illustrated in FIG. 4A.

FIG. 5 is a block diagram of one embodiment of the present invention.

FIG. 6 is a schematic diagram of one bit slice of a second embodiment of the present invention.

FIG. 7 is a block diagram of the second embodiment of the present invention.

FIGS. 11A and 11B are timing diagrams of illustrating a potential problem with phase relationships when at least one of the dividers in a frequency synthesizer has a reducible divide value.

FIG. 12 is a block diagram of the reset cell driver which would eliminate phase problems if one of the dividers is reducible.

FIG. 13 illustrates a block diagram illustrating a frequency synthesizer having two resettable Johnson counters coupled together through a common reset cell signal line so that both counters are synchronously reset.

FIG. 14 illustrates a block diagram of the frequency synthesizer of FIG. 13 having a switch mechanism to disconnect the reset cell signal line coupling each of the dividers.

DETAILED DESCRIPTION OF THE INVENTION

Figure 8:
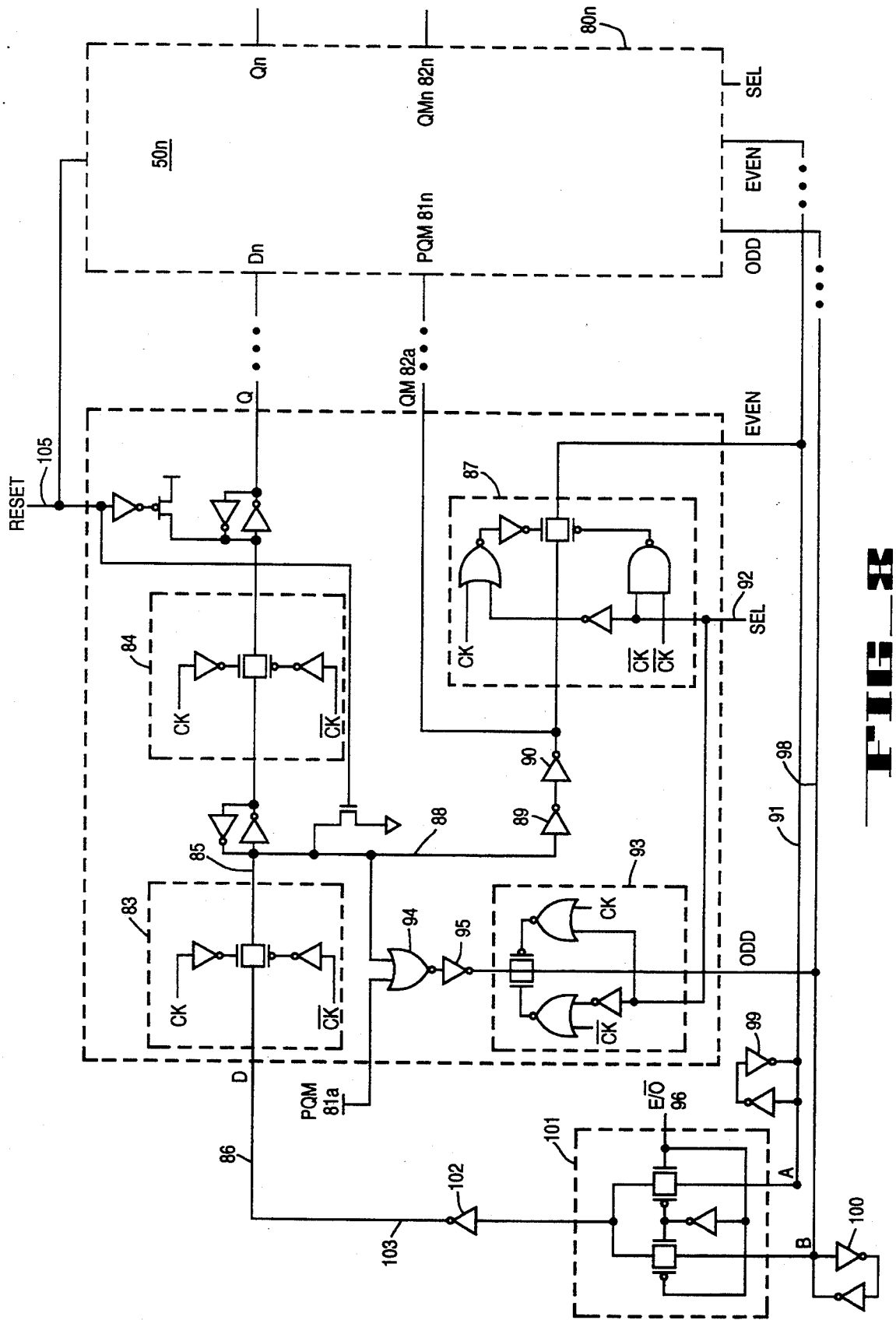
FIG. 8 is a schematic diagram of a bit slice of a third embodiment of the present invention, wherein the bit slice incorporates an additional slave latch in order to provide "odd" divisional capabilities.

In the following description, an apparatus and method are described for frequency synthesis and clock generation in which the apparatus is programmable to support many different clocking requirements. The apparatus is a programmable Johnson counter that is resettable in order to avoid illegal sequences which would cause the Johnson counter to fail. In the following detailed description, numerous specific details are set forth, such as, for example, specific internal components forming the Johnson counter. It is apparent, however, to one skilled in the art that the present invention may be practiced by incorporating similar components to achieve the same desired result. Furthermore, it should be borne in mind that the present invention need not be limited to frequency synthesis and clock generation with respect to microprocessors, but may find wide application for establishing frequency synthesis and clock generation in any electrical device.

As previously stated, frequency synthesis in commonly obtained by incorporating dynamic feedback loops like the PLL 2. The PLL 2 internally generates the oscillator signal having the first frequency into the first and second dividers 5 and 6, resulting in the MP_CLK signal 7 and the I/O_CLK signal 8. The signal delay through the first and second dividers are equivalent in order to eliminate skew between the MP_CLK signal 7 and the I/O_CLK signal 8, regardless of each divider's programmed divide value. In addition, the I/O_CLK signal 8 is fed back into the PLL 2 to eliminate skew between the external system clock 10 and the I/O_CLK signal 8.

In the current marketplace, there exists many different types of dividers. One example is a binary "n" ripple counter 11 as shown in FIG. 2A in which "n" is any whole number greater than one. The binary n-ripple counter 11 comprises "n" ripples (i.e., D-type flip-flop) $12a-12n$ cascaded together such that an output signal of a previous ripple (except a first ripple 12A) is coupled to a clock input of the next ripple via clocking lines $13b-13n$. As shown in FIG. 2B, upon inputting a signal having a predetermined clocking frequency ("CLK") 14 into a first ripple $12a$, an output signal of each ripple in succession, being designated as $Q_1-Q_n$, is equal to one-half its input frequency (i.e., $Q_1$ is one-half the frequency of the CLK signal 14, $Q_2$ is one-half the frequency of $Q_1$ and so on).

The problem associated with binary ripple counters is that they have an extremely slow critical path defined as a time duration between the CLK signal 14 going high and activation of the last bit output $Q_n$. Each ripple incurs a time delay equal to "Δ," as shown in FIG. 2B. Thus, for large ripple counters where "n" is equal to a large number, the delay is equal to $n \times \Delta\Delta$, which is a large time delay. For frequency synthesis applications, it is not desirable to have variable output delays dependent on "n" since, as previously stated above, the first and second dividers 5 and 6 are required to output the MP_CLK and I/O_CLK signals 7 and 8 with equal delays, even if these dividers 5 and 6 have different divide values.

Another example of a conventional divider is a synchronous binary counter as shown in FIG. 3A. The synchronous binary counter 15 comprises a plurality of flip-flops $16a-16n$, preferably D-type flip-flops, in which the output of such flip-flops is toggled upon detection that an immediately preceding flip-flop output is active in a preceding clock cycle. For example, a four bit synchronous binary counter 15 and associating timing diagrams are shown in FIGS. 3A and 3B, which sufficiently illustrate the operation of the synchronous binary counter 15.

Although the synchronous binary counter 15 outputs data within a data cycle having equivalent delays for each of its outputs $Q_1-Q_4$, it is not fast enough for certain high clocking speed applications since the data cycle time is required to be longer than the delay due to the logic outside the flip-flop. Another disadvantage is that the clocking speed of this divider degrades with longer divide values due to increases in necessary logic. Moreover, the synchronous binary counter 15 as well as the binary, n-ripple counter 11 output only even divisions. Odd division capabilities are extremely difficult to perform, if at all possible.

As a result, circuit designers have turned to conventional Johnson counters 20 to perform high frequency synthesis as well as high speed clock generation. The conventional Johnson counter 20 operates as a high-speed divider since its clocking rate is only limited by logic within each flip-flop plus one additional inverter delay. The conventional Johnson counter 20 is divisible in proportion to its number of flip-flops; namely, a conventional n-bit Johnson counter 20 (i.e., a Johnson counter having "n" flip-flops cascaded together) is able to divide an input signal by "2n". For illustrative purposes, FIGS. 4A and 4B feature circuit and timing diagrams of the conventional 4-bit Johnson counter 20.

The conventional 4-bit Johnson counter 20 comprises four flip-flops 21-24, generally D-type flip-flops, cascaded together via four output signal lines 25-28 originating from outputs of the four flip-flops 21-24 designated as "$Q_1-Q_4$" respectively, and a common clocking signal line 29 for synchronous purposes. The four output signal lines 25-28 couple the four flip-flops 21-24 together in such a manner that the output of a first flip-flop 21 ("$Q_1$") is coupled to a D-input of a second flip-flop 22 ("$D_2$") and so on. An output of a fourth flip-flop 24 "$Q_4$") is coupled to the D-input of the first flip-flop 21 ("$D_1$") via a fourth output signal line 28, wherein an inverter 30 is placed onto the fourth output line signal 28 in order to toggle the signals outputted from $Q_1-Q_4$.

As shown in FIG. 4B, the corresponding output signals from each of the four flip-flop 21-24 are illustrated in detail, in which the signal transmitted through the $Q_1$ output has a frequency eight times slower than the common clock since the 4-bit Johnson counter 20 operates as a divide-by-eight divider. Moreover, the $Q_2-Q_4$ outputs of the second through fourth flip-flops 22–24 also operate at a frequency eight times slower than the common clocking, but are shifted accordingly.

One problem associated with conventional Johnson counters is that they are not programmable which prevents quick alterations of such counters in order to accommodate various customer requirements for different internal clocking speeds. As a result, modifications to internal clocking schemes were difficult to coordinate and costly to perform. Another problem associated with conventional Johnson counters is that it is necessary to reset these counters during initialization in order to prevent unwanted signal frequencies from occurring.

Referring now to FIG. 5, it illustrates a first embodiment of the present invention having programmable and resettable features. In the first embodiment, the Johnson counter 40 comprises a plurality of flip-flops 41a–41n, preferably D-type flip-flops, cascaded together wherein an input of each flip-flop $D_2$–$D_n$ is coupled to a bit output of a previous flip-flop $Q_1$–$Q_{n-1}$, with exception to the input of the first flip flop 41a. The input signal $D_1$ of the first flip-flop 41a is coupled to a selected output signal line 45 from a multiplexor 46.

The bit outputs $Q_1$–$Q_n$ of each of the corresponding flip-flops 41a–41n are inputted into an odd-even logic gates block 44 via signal lines 42a–42n. The odd-even logic block 44 comprises combinatorial logic gates arranged in order to generate "2n−1" output signals $E_{Q1}$–$E_{Qn}$ and $O_{Q2}$–$O_{Qn}$. Only "2n−1" output signal lines are needed because no divide-by-1 signal is necessary.

Each of the output signals $E_{Q1}$–$E_{Qn}$ and $O_{Q2}$–$O_{Qn}$, when selected to be outputted through the selected output signal line 45, provides an unique frequency harmonically related to (i.e., a function of) a predetermined clock signal ("CK signal") 43 as follows:

$E_{Qx} = CK/2x$ (where "x"=1,2 ... n); and $O_{Qx} = CK/(2x−1)$ (where "x"=2,3 ... n)

It is noted that the frequency of each of the output signals $E_{Q1}$–$E_{Qn}$ and $O_{Q2}$–$O_{Qn}$ is dependent on which output signal is chosen and fed back into the counter 40. Thus, in order to obtain a desired divide value, care must be taken to properly select the appropriate output signals $E_{Q1}$–$E_{Qn}$ and $O_{Q2}$–$O_{Qn}$.

The odd-even logic block 44 is necessary to provide additional odd divisional capabilities because the Johnson counter 40 is only capable of performing "even" divisions. For the scope of this description, "odd divisions" refers to dividing the frequency of an input signal by an "odd" number being equal to three, five, seven, nine, etc., while "even" division refers to dividing the input frequency by an "even" number such as two, four, six, etc.

Figure 10:
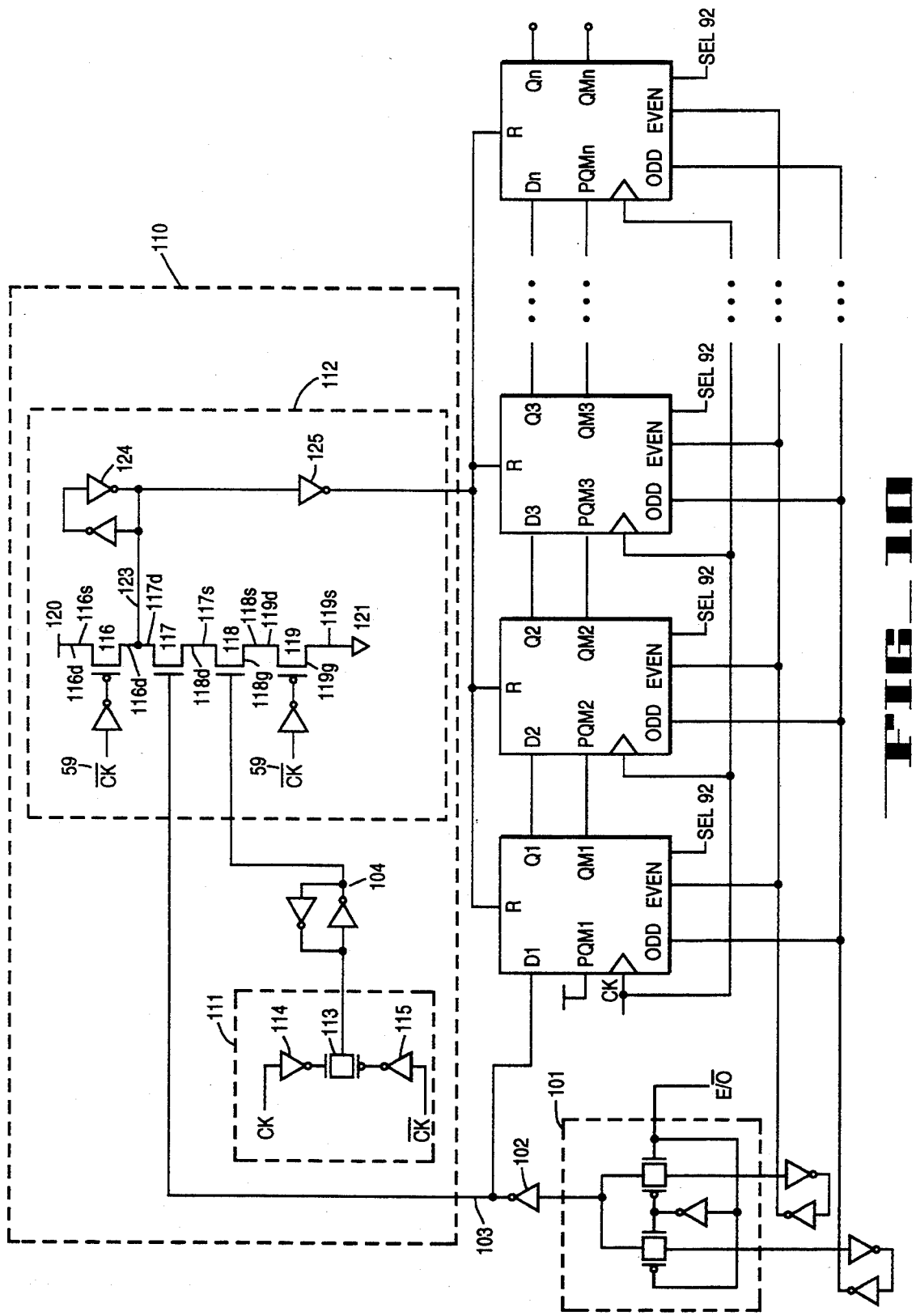
FIG. 10 is a block diagram of a fourth embodiment of the present invention incorporating a self-reset mechanism within each bit slice of the present invention.

The logic output signals $E_{Qa}$–$E_{Qn}$ and $O_{Qb}$–$O_{Qn}$ are inputted into a multiplexor 46 providing "2n−1" channels corresponding to each of the logic output signals $E_{Q1}$–$E_{Qn}$ and $O_{Q2}$–$O_{Qn}$ and only one multiplexor output line 45. A select line 47 having "2n−1" bit lines, or alternatively a predetermined number of bit lines in combination with a decoder, is activated to select which logic output signal is to be outputted from the multiplexor 46 through the multiplexor output line 45. In general, the select signal 47 is used to configure the Johnson counter 40 to be a divide-by-n divider where $n \geq 2$. The multiplexor output line 45 is coupled to an inverter 48 for toggling purposes and thereafter, sampled before being fed back into the input $D_1$ of the first flip-flop 41a. In addition, resettability is provided in this embodiment through reset lines 49a–49n inputted into each of the flip-flops 41a–41n respectively. These reset signals may be self-resetting or require external activation as shown in FIGS. 6 and 10 discussed below.

Although this embodiment is functional, the multiplexor 46 having "2n−1" inputs may unwantedly impede the critical path of the Johnson Counter 40. Moreover, the odd-even logic block 44 further impedes the critical paths. In order to eliminate speed problems associated with the odd-even logic block 44 and the multiplexor 46, the logic of either the odd-even logic block 44, the multiplexor 46 or both could be incorporated within each of the plurality of flip-flops 41a–41n, so as to form a corresponding plurality of Johnson counter bit slices.

A. Embedding Programmable Logic Into The Present Invention

Normally, conventional flip-flops forming the Johnson counter include a master latch and a first slave latch coupled together in series so as to act as an edge-sensitive flip-flop. However, in the present invention as shown in FIG. 6, which illustrates one of a plurality of bit slices 50, where each of the bit slices 50a–50n incorporates a similar construction. The bit slice 50 comprises a second slave latch 53 coupled to the master latch 51 via a parallel data line 54. The second slave latch 53 enables the bit slice 50 to perform multiplexing tasks without excessive delay and to enable various bit sizes to be chosen. Similarly, odd-even logic can also be embedded, as subsequently illustrated in FIG. 8.

In FIG. 6, the present invention includes the master latch 51 coupled to the first slave latch 52 through a primary signal line 55. The master and slave latches 51 and 52 are implemented so that a signal inputted into a D-input 56 of the bit slice 50 would be captured in the master latch 51 when the CK signal is "low" (i.e., logic zero), and then outputted from the slave latch 52 through a Q-output 60 when the CK signal goes "high" (i.e. logic one). Cross-coupled inverters 57 and 58 were incorporated to provide static capabilities to the bit slice 50. Additionally, the master latch 51 is coupled to the second slave latch 53 through the parallel signal line 54 having two inverters 61a and 61b in series in order to drive the second slave latch 53 and a secondary bit output signal line ("OUT1") 74.

The second slave latch 53 comprises a third pass gate 62, wherein a PMOS portion of the third pass gate 62 is coupled to an output of a dual-input NAND gate 63. A first input 63a of the NAND gate 63 is coupled to a bit slice select line 64 while a second input 63b is coupled to the CK signal 43 being, for example, the internal oscillator 3 within the PLL 2 as shown in FIG. 1. The bit slice select line 64 is further coupled to an inverter 65, which is then coupled to a first input 66a of a dual-input NOR gate 66. An output of the NOR gate 66 is coupled to a NMOS portion of the third pass gate 62. A second input of the NOR gate 66 is coupled to a clock source 59 being a complement of the CK signal 43 (hereinafter referred to as "the $\overline{CK}$ signal"). When the bit slice select line 64 is selected, the NAND gate 63 and the NOR gate 66 operate as inverters so as to emulate the first slave latch 52. Thus, the second slave latch 53 drives a output signal onto a feedback loop through the secondary bit output signal line 74.

In this configuration, it is desirable that the delays associated with both the CK and $\overline{CK}$ signals 43 and 59 are identical. Such identical delays are essential for optimum synchronous operations.

As further shown in FIG. 6, a reset mechanism of the 5 bit slice is accomplished by coupling a drain 67d of a NMOS transistor 67 to a first storage node 72a of the master latch 51. A source 67s of the NMOS transistor 67 is grounded so that when a gate 67g of the transistor 67 is closed by activating a Reset signal line 68, a logic-low signal is inputted into the second slave latch 53. Moreover, the Reset signal line 68 is further coupled to an inverter 69 which, in turn, is coupled to a gate 70g of a PMOS transistor 70. A source 70s of the PMOS transistor 70 is coupled to a logic-high power supply 71, such as a +5 volt power supply. A drain 70d of the PMOS transistor 70 is coupled to second storage node 72b in between the first slave latch 52 and the second cross-coupled gates 58. As a result, when the Reset signal line 68 is active, the gate 70g is closed so that the logic-high signal is driven onto a first slave latch output signal line 73 at the second storage node 72b so that the high voltage signal is inverted to become a low signal which is outputted from the bit slice 50 for use by other bit slices coupled thereto. It is contemplated that a person skilled in the art could employ any similar reset mechanism to accomplish the same result.

Referring now to FIG. 7, it illustrates a plurality of bit slices 50a–50n coupled together to form the Johnson counter 76 through bit slice output signal lines 75a–75n-1 and the common secondary bit output signal line 74 through individual secondary bit output signal lines 74a–74n. The Johnson counter 76 has resetting features identical to those described in FIG. 6. Although no odd-even logic is illustrated, it can be incorporated within the second embodiment by coupling such logic individually to each individual secondary bit output signal line with additional selectable features.

An output of the Johnson counter Jo is sampled from a counter output signal line 77. Only one bit slice is allowed to drive the common secondary bit output signal line 74. This is accomplished by activating only one of the individual secondary bit output signal lines 74a–74n to drive a cross-coupled inverter 78 and a toggling inverter 79. By incorporating the multiplexing logic into the bit slices 50a–50n, data delay is substantially reduced. In the present invention, no matter which bit slice is selected, the clocking rate is only limited by a constant delay caused by three inverters and two pass gates. Moreover, the delay from the CK signal to the counter output signal line 77 is constant no matter which bit slice, programming value, or divide value is selected.

B. Embedding Odd-Even Logic Into The Present Invention

As previously discussed, dividers are capable of being configured to perform "odd" division. Such configuration is typically accomplished by monitoring the divider for a specific vector pattern (i.e., a combination of outputs from each bit slice), and once detected, skipping a subsequent vector pattern.

For example, in order to allow divide-by-7, one state is skipped from the regular divide-by-8 sequence shown in Table 1 (below). This could be accomplished by designing a divide-by-7 which would automatically force bit output Q4 "high" if the bit output Q3 is detected "high". As a result, a divide-by-8 could be modified into a divide-by-7 by incorporating logic so that state 1110 immediately becomes state 1111; the net result being that is state 1110 being skipped as illustrated in Table 2 (below).

TABLE 1

| Legal sequence of a four bit slice Johnson Counter | | | |
|---|---|---|---|
| Q1 | Q2 | Q3 | Q4 |
| 0 | 0 | 0 | 0 |
| 1 | 0 | 0 | 0 |
| 1 | 1 | 0 | 0 |
| 1 | 1 | 1 | 0 |
| 1 | 1 | 1 | 1 |
| 0 | 1 | 1 | 1 |
| 0 | 0 | 1 | 1 |
| 0 | 0 | 0 | 1 |

TABLE 2

| Sequence of a divide-by-seven Johnson Counter | | | |
|---|---|---|---|
| Q1 | Q2 | Q3 | Q4 |
| 0 | 0 | 0 | 0 |
| 1 | 0 | 0 | 0 |
| 1 | 1 | 0 | 0 |
| 1 | 1 | 1 | 0 | ←State skipped
| 1 | 1 | 1 | 1 |
| 0 | 1 | 1 | 1 |
| 0 | 0 | 1 | 1 |
| 0 | 0 | 0 | 1 |

However, such "odd" dividers do not lend themselves well to frequency synthesis nor are they programmable. In frequency synthesis, it is often desired that the ratio between the internal and external clocks be programmable, thus offering maximum flexibility to the user of the integrated circuit.

FIG. 8 illustrates a third embodiment of the present invention incorporating combinatorial logic simulating the odd-even logic block shown in FIG. 6 within each of the plurality of bit slices 80a–80n in order to support odd divisions. In this embodiment, each of the plurality of bit slices 80a–80n further includes a PQM-input 81a–81n and a corresponding QM-output 82a–82n. The PQM-inputs 81a–81n are used to receive information pertaining to a present state of a master latch in a preceding bit slice. The present state is transferred out of the master latch in the preceding bit slice through the corresponding QM-output 82a–82n. By coupling a QM output of the preceding bit slice to the PQM input of an adjacent bit slice, information from the master latch can be used to predict and skip states in the adjacent bit slice. For illustrative purposes, however, we will focus our discussion on the configuration of the first bit slice 80a since the bit slices 80a–80n are virtually identical.

Similar to the circuit illustrated in FIG. 6, each bit slice 80a–80n includes a master latch 83 coupled to a first slave latch 84 through a primary output signal line 85 constituting an edge-triggered flip-flop. A second slave latch 87 is coupled to the master latch 83 through a parallel output signal line 88 having two inverters 89 and 90. The second slave latch 87 drives an "even" divided input signal onto an "even" feedback signal line 91 and thereafter, into the D-input of the first bit slice 80a if selected by a bit slice select line 92 and an even-/odd select line 96. However, contrary to the second embodiment which only incorporates additional logic to enable the bit slice 80a in FIG. 6 to perform an even frequency division, the bit slice 80a further includes a third slave latch 93 in order to enable odd frequency division. The third slave latch 93 is coupled to the PQM input 81a and the parallel output signal line 88. Generally, except for the first bit slice 80a, the PQM 81b–81n is coupled to a preceding QM-output 82a–82$_{n-1}$. For the first bit slice 80a, the PQM 81a is coupled to a logic-high voltage supply 97 because we do not allow divide-by-one.

The PQM input 81a and the second master output signal line 88 are coupled to a NOR gate 94. The NOR gate 94, in combination with an inverter 95, provide sufficient drive to the third slave latch 93 and its corresponding output 98. The third slave latch 93 drives an "odd" divided signal onto an odd feedback signal line 98 for frequency division by an "odd" number when selected by the bit slice select line 92 and the even/odd select line 96. Two cross-coupled inverters 99 and 100 are coupled respectively to the even and odd feedback signal lines 91 and 98 at nodes A and B for static purposes and are inputted into a dual-input multiplexor 101, in which its output, a selected feedback signal, is based on whether the even/odd select line 96 is activated or not. The selected feedback signal is first inverted by an inverter 102 and then is inputted into the D-input of the first bit slice 80a via a counter output signal line 103. In FIG. 8, resettability is accomplished through two transistors appropriately coupled to a RESET signal line 105 in a manner identical to that of FIG. 6.

Figure 9:
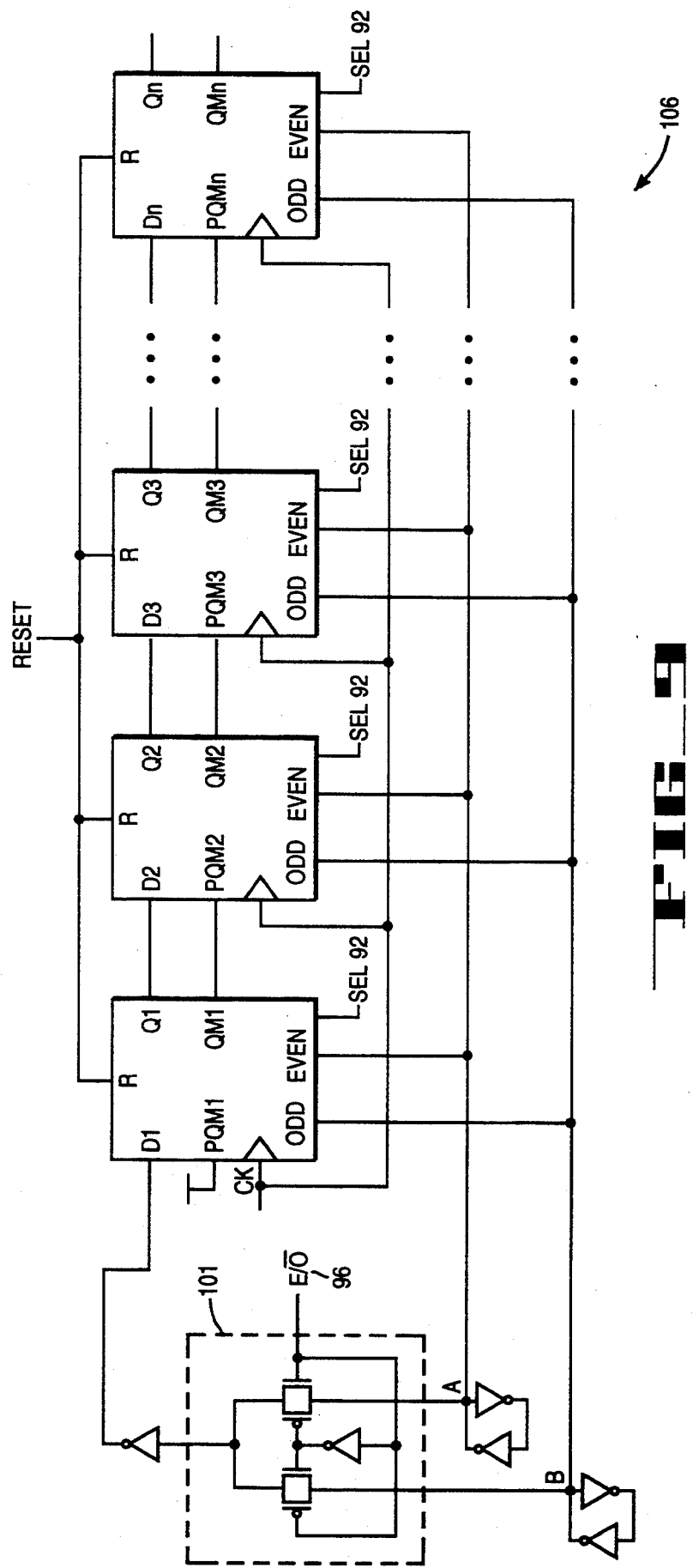
FIG. 9 is a block diagram of the third embodiment of the present invention.

FIG. 9 shows the cascading of "n" bit slices to form a programmable Johnson counter that can divide by 2, 3, 4, 5, 6 . . . 2n−1, or 2n, depending on a particular selection of the bit slice select line 92 and the even/odd select line 96. Similar to FIGS. 5–8, a D-input of one bit slice is tied to a Q-output of the preceding bit slice.

By programming which bit slice is selected and whether even or odd programming is desired, the Johnson counter 106 is capable of dividing by any whole number within a range between 2 to 2n. The Johnson counter 106 is very fast because its critical path forming the feedback loop only consists of three inversions and 3 pass-gates (assuming 1 pass-gate delay is in the multiplexor 101) as shown in FIG. 8. Accordingly, the Johnson counter 106 has been simulated to work beyond a 700 MHz clocking frequency utilizing 0.7 μm CMOS technology which is also achieved for Johnson counters having greater bit sizes because the design can be arbitrarily scaled in capacitance at nodes A and B for driving purposes. For example, if an 8-bit Johnson counter is desired, then nodes A and B would be roughly twice as heavy in capacitance as the 4-bit Johnson counter. All the devices in the bit slice would have to be sized up twice to maintain operation at 700 MHz. Similarly, the inverter 102 and multiplexor 101 would have to be sized up twice to drive signal thereon in the same amount of delay. The final effect is a larger load placed on the input clocks CK and $\overline{CK}$ signals 43 and 59 to retain their consistency and higher power consumption by the counter. The extra CK and $\overline{CK}$ loading, and therefore delay, is inconsequential in PLL-based frequency synthesis systems whereby the dominant pole of the PLL is usually much longer than the delay from the output of the PLL to the feedback of the I/O_CLK signal via the dividers. The important aspect is to maintain equal delay through both dividers.

C. Embedding Self-Resettability Into The Present Invention

It is commonly known that a Johnson counter of any length has two sets of sequences, one of which is a legal sequence and the other an illegal sequence. It is clear that a n-bit counter provides divide-by-2n functionality, and thus, its legal counting sequence is "2n" long. Table 3 illustrates the legal counting sequence for a 4-bit Johnson counter. The 4-bit Johnson counter is chosen merely for illustrative purposes, but it is contemplated that the legal and illegal sequences could be ascertained for "n"-bit Johnson counter where "n" is equal to any whole number.

TABLE 3

| Legal Sequence for a 4-bit Johnson Counter | | | |
|---|---|---|---|
| Q1 | Q2 | Q3 | Q4 |
| 0 | 0 | 0 | 0 |
| 1 | 0 | 0 | 0 |
| 1 | 1 | 0 | 0 |
| 1 | 1 | 1 | 0 |
| 1 | 1 | 1 | 1 |
| 0 | 1 | 1 | 1 |
| 0 | 0 | 1 | 1 |
| 0 | 0 | 0 | 1 |

In view of the fact that there are "2n" legal sequences for the n-bit Johnson counter, there would exist an illegal sequence consisting of the remaining possible permutations of the "2n" (8) bits; namely, $2^n - 2n$ (8) as illustrated in Table 4 set forth below.

TABLE 4

| Illegal Sequence for a 4-bit Johnson counter. | | | |
|---|---|---|---|
| Q1 | Q2 | Q3 | Q4 |
| 1 | 0 | 1 | 0 |
| 1 | 1 | 0 | 1 |
| 0 | 1 | 1 | 0 |
| 1 | 0 | 1 | 1 |
| 0 | 1 | 0 | 1 |
| 0 | 0 | 1 | 0 |
| 1 | 0 | 0 | 1 |
| 0 | 1 | 0 | 0 |

In order to ensure that a counter does not get stuck in an illegal sequence, appropriate measures must be taken to reset the counter upon encountering an illegal sequence.

It is noted that all legal sequences include a null vector, that is, a combination where the outputs of each bit slice is equal to zero. Moreover, it is further noted that there does not exist any other vectors in a legal sequence that provides a vector pattern having a zero in the first and last bit outputs simultaneously. As a result, it is possible to reset the Johnson counter by watching out for zero values in the first and last bit, which in this example, are the $Q_1$ and $Q_4$ outputs. Whenever this condition is encountered, all bits are reset to zero, thus ensuring that the legal sequence is performed.

Although the embodiments in FIGS. 5–9 are operational, such embodiments rely on external resettability. It is critical, however, that the counter be able to always avoid the illegal sequence. In frequency synthesis applications, an external reset is often not desired. It is highly advantageous that the counter be self-resetting; wherein the reset operation is done only once every power up. Once the counter is reset, it remains in the legal counting sequence until power is turned off. Also, in PLL-based systems, the internal oscillator is often designed to begin oscillating at slow frequency on application of power. Since the dividers are clocked by the internal oscillator, the reset mechanism would not be required to operate at a maximum frequency.

FIG. 10 shows the fourth embodiment of a Johnson counter identical to that illustrated in FIG. 8 but including a self-reset driver cell 110. The reset driver cell 110 comprises an auxiliary master latch 111 and a transistor tree 112 coupled together as set forth below. The auxiliary master latch 111 is identical in structure to the first master latch in bit-slices 80a–n and comprises a pass gate 113 wherein the predetermined clock source 43 is coupled to inverter 114 which activates and/or deactivates a NMOS portion 113a of the pass gate 113. The complementary predetermined clock source 59 is also coupled to an inverter 115, but the complementary predetermined clock source 59 activates and/or deactivates a PMOS portion 113b of the pass gate 113. The pass gate 113 receives information from the counter output signal line 103 and passes the information through an auxiliary master output signal line 104 to the transistor tree 112. The delayed information stored in the auxiliary master latch 111 represents the previous state of the counter output signal line 103.

The transistor tree 112 includes four transistors 116–119 being a PMOS transistor 116 and three NMOS transistors 117-119, wherein these transistors 116–119 are alternatively coupled together via source and drain, except for a source 116s of the PMOS 116 is coupled to a voltage source 120 while a source 119s of a third NMOS transistor 119 is coupled to ground 121. A gate 116g of the PMOS transistor 116 is coupled to an inverter 122 which receives the complementary predetermined clock source 59 as input. Gates of a first, second and third NMOS transistors 117g–119g are coupled to the feedback signal line 103, the auxiliary master output signal line 104 and an inverter 126 which receives the complementary predetermined clock source 59 as input. An "active-low" transistor tree output signal line 123 is coupled between a drain 116d of the PMOS transistor 116 and a drain 117d of the first NMOS transistor 117. This arrangement is generically known as "domino logic," in this case, a domino NAND type gate.

Under normal conditions when reset is not required, the complementary predetermined clock source 59 will cause the transistor tree output signal line 123 to be periodically driven high and remain high until the counter output signal line 103 and a complementary auxiliary master output signal line 104 are high. Such a condition will cause the reset cell output signal line 123 to be pulled "low" when the complementary predetermined clock source 59 goes low. The low-level signal becomes static due to the cross-coupled inverters 124 and is inverted by the inverter 125 so as to become a high level signal which is inputted into the bit slices 80a–80n to reset them according to the reset mechanism illustrated in FIG. 6.

Accordingly, resetting is accomplished in the following manner. Referring back to Table 3 for illustrative purposes, certain conditions are known to occur when operating in a legal sequence. For example, when $Q_1$ and $Q_4$ are low, the middle bits must be "low". Moreover, as shown in FIG. 10, when the CK signal 43 goes high, the last bit of the counter being "low" is propagated through the multiplexor 101, the inverter 102, and the counter output signal line 103.

Similarly, when the CK signal goes high, the previous value on the counter output signal line 103 is trapped in the master auxiliary latch 111. This logic value corresponds to the inverted value of the master latch 83 in the first flip-flop 50a shown in FIG. 8. Thus, if the auxiliary master output signal line 104 is "high", it is anticipated that $Q_1$ will go low on the next high-going edge of CK. Therefore, if the auxiliary master output signal line 104 and the counter output signal line 103 are "high", on the next high-going CK edge, the state of the counter is 0XXXX . . . 0. A reset is generated during the next cycle to force the state to be 000 . . . 0, thus ensuring operation in the legal sequence.

Referring back to Table 4, if the counter cycles in the illegal sequence, it must encounter at least 1 state which looks like 0XXX . . . 0. (e.g., in a four bit-slice counter, it would be states 0010 or 0100). Upon reaching such a state, the reset mechanism forces all zeros on the counter outputs, thus transferring to the legal sequence in Table 3.

Additionally, besides a self-resetting mechanism, it is often desired that the two dividers reset simultaneously in order to achieve phase synchronization and thereby eliminate skew. Such the reset operation can be used to reset two dividers required for frequency synthesis.

D. Providing Synchronous Operation Between Counters.

As mentioned when referring to FIG. 1, it is often desired to have more than one divider to perform frequency synthesis. By programming different values in the first and second dividers 5 and 6, the MP_CLK signal 7 could be synthesized to run at a fraction of the I/O_CLK signal 8. Unfortunately, a synchronous problem occurs when the first and second dividers 5 and 6 are programmed to have reducible divide values (i.e., not having its simplest fraction form). For example, if the first divider 5 is programmed to be a divider-by-two and the second divider 6 is programmed to be a divide-by-four, then the MP_CLK signal 7 runs at 4÷2 or twice the I/O_CLK frequency. Even though there exists the self-reset mechanism within each counter, there is potential ambiguities in phase between the two outputs of the counters., as shown in FIG. 11A and 11B. The phase relationship in FIG. 11A is desired; the phase relationship in FIG. 11B is not. Thus, it is necessary to phase synchronize the two counters when at least one divider has a reducible divide value, meaning that the divider is not in its simplest fraction form. In this document, a simple fraction is one that cannot be represented by smaller numerator or denominator.

Looking at FIGS. 11A and 11B, it is readily apparent that if the two dividers are coupled in a manner such that the second divider 6 having a larger divide value resets the first divider 5, the phase synchronous operation is attained. In the fourth embodiment, a reset driver cell is modified as shown in FIG. 12.

The reset driver cell 130 is similar to the reset driver cell 110 in FIG. 10, except for two slight changes. First, the third NMOS transistor 119 is coupled to an enable input ("EN") 131 which is coupled to both an OR gate 132 via an inverter 133 and to the $\overline{\text{CK}}$ signal 59. Second, the PMOS transistor 116 is coupled to a NAND gate 134 having both the $\overline{\text{CK}}$ signal 59 and the EN input 131 as inputs. When the EN input 131 is "high," the reset driver 130 operates in a manner similar to the reset driver cell 110 of FIG. 10; however, when the EN input 131 is "low," a reset cell output signal line 135 tri-states to prevent resetting other dividers coupled to the reset cell output signal line 135 as shown in FIGS. 13 and 14 below.

Referring to FIG. 13, it illustrates a first and second dividers 141 and 142 coupled together in a typical frequency synthesizer 140. Each divider has an enable input END1 and END2 respectively. For illustrative purposes, the second divider 142 is programmed with a larger divide value than the first divider 141. In this case, if the END2 input is "high", the second divider 142 resets itself and also the first divider 141 via the output signal line 135. Meanwhile, the END1 input of the first divider 141 is "low" so that its reset driver is not driving the reset cell output signal line 135. A problem exists, however, when both of the dividers have a non-reducible divide value. In this case, the dividers should be decoupled. The reason being that it is desirable to leave the two dividers uncoupled (in reset) since the self-resetting feature would always put the counters in their legal sequences and there is no ambiguity in phase relationship between the two outputs. This is done as shown in FIG. 14.

When either of the dividers have non-reducible divide values (i.e. a SIMFRAC signal line 144 being "high") the coupling between first and second dividers 141 and 142 is removed by disconnecting a switch 143. Thus, the first divider 141 is allowed to reset itself. When the SIMFRAC signal line 144 is "low" (denoting non-simplified fraction and possibility phase ambiguity), the switch 143 is connected establishing a continuous reset cell output signal line 135 between the first and second dividers 141 and 142. There, taking the above example, the END1 is low while the END2 input is high.

One final feature of the preferred embodiment is the addition of an external reset to the Johnson counter pair. In designing CMOS microprocessors, it is highly desired that the microprocessor can be put into a static mode for debug and test convenience. In the static mode, the PLL (which is dynamic system) is bypassed. Instead, an external clock source is applied to the input clock of the two Johnson counters. In this way, test programs are able to shorten or elongate the input clock period at any desired point in the test in order to track down exact failing points in the test pattern. By inputting a high frequency clock (equivalent in value to the frequency of the PLL oscillator during normal operation), normal operating conditions are duplicated for the microprocessor.

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What we claim is:

1. A dividing circuit for frequency synthesis of an input clock signal having a preselected frequency to provide a divider output signal having a desired frequency, the dividing circuit comprising:
    counter means for generating a plurality of bit output signals in parallel, the counter means including a first plurality of flip-flops cascaded together, each output of the first plurality of flip-flops having a bit output signal line coupled thereto;
    resetting means for re-initializing the plurality of bit output signals;
    multiplexor means for selecting the divider output signal from the plurality of bit output signals; and
    feedback means for inputting the divider output signal into the counter means.

2. The dividing circuit according to claim 1, wherein a first bit output signal line, when selected by the multiplexor means, results in each bit output signal of the first plurality of flip-flops having the desired frequency, where the desired frequency is equal to one-half the preselected frequency.

3. The dividing circuit according to claim 1, wherein a "n" bit output signal line, when selected by the multiplexor means, results in each bit output signal of the first plurality of flip-flops having the desired frequency, where the desired frequency is equal to the preselected frequency divided by 2n, where $n \geq 2$.

4. The dividing circuit according to claim 1, wherein the counter means further includes logic means for generating the plurality of bit output signals, the logic means being coupled to the plurality of cascaded flip-flops through the first plurality of bit output signal lines, the logic means being further coupled to the multiplexor means by a plurality of bit output signal lines corresponding to the plurality of bit output signals.

5. The dividing circuit according to claim 4, wherein each of the plurality of bit output signal lines, if selected, represents a frequency being an unique function of the preselected frequency, wherein a first bit output signal of the plurality of bit output signals represents a first frequency equal to the preselected frequency divided by "m", where "m" is an even number greater than or equal to one, and a second bit output signal of the plurality of bit output signals represents a second frequency equal to the preselected frequency divided by "p", where "p" is equal to an odd number greater than one.

6. The dividing circuit according to claim 4, wherein the plurality of bit signals includes at least one bit output signal line, when selected, by the multiplexor means, results in each of the plurality of bit output signals having the desired frequency, wherein the desired frequency is equal to one-third the preselected frequency.

7. The dividing circuit according to claim 1, wherein the multiplexor means includes a multiplexor having a plurality of channels corresponding to the plurality of bit output signals and an input means for selectively driving one of the plurality of channels receiving the divider output signal onto the feedback means.

8. The dividing circuit according to claim 7, wherein the feedback means includes a feedback signal line with an inverter, the feedback signal line being coupled to the counter means.

9. A dividing circuit for frequency synthesis of an input clock signal having a preselected frequency in order to provide a divider output signal having a desired frequency, the dividing circuit comprising:
    a multiple bit counter including a first plurality of cascaded flip-flops, wherein each output of the first plurality of cascaded flip-flops is separately coupled to a bit output signal line such that a plurality of bit output signals corresponding to the first plurality of cascaded flip-flops are outputted in parallel through the bit output signal lines,
    logic circuitry coupled to the first plurality of cascaded flip-flops through the bit output signal lines, wherein the logic circuitry generates a plurality of bit output signals which includes the corresponding plurality of bit output signals from the multiple bit counter and at least one bit output signal representing a frequency not harmonically related to any frequencies of the corresponding plurality of bit output signals if any one of the corresponding plurality of bit output signals is selected;
    a resetting mechanism for re-initializing the plurality of bit output signals;

a multiplexor coupled to the logic circuitry through a plurality of signal lines corresponding to the plurality of bit output signals generated by the logic circuitry, the multiplexor being selected to transmit the divider output signal being one of the plurality of bit output signals; and a feedback signal line for inputting an inverted counter output signal into the multiple bit counter.

10. A dividing circuit for frequency synthesis of an input clock signal having a preselected frequency in order to obtain a divider output signal having a desired frequency, the dividing circuit comprising:

counter means for generating a plurality of bit output signals, the counter means includes a plurality of cascaded bit slices clocked by the input clock signal, each of the plurality of cascaded bit slices includes means for latching information being inputted into a bit slice and for outputting the information through a bit output signal line, means for selectively driving the divider output signal having the desired frequency through a feedback circuit, and resetting means for re-initializing the bit slice.

11. The dividing circuit according to claim 10, wherein the latching means includes a master latch and a first slave latch coupled together through a primary signal line, wherein the master latch captures the information inputted into the bit slice and transfers the information to the first slave latch while the first slave latch drives the information from the bit slice.

12. The dividing circuit according to claim 10, wherein the driving means includes a second slave latch coupled to the master latch through a parallel signal line and the feedback circuitry through an bit output signal line.

13. The dividing circuit according to claim 12, wherein the second slave latch emulates the first slave latch upon activation of a select line coupled to the second slave latch so that the second slave latch drives the divider output 3signal onto the feedback circuitry.

14. The dividing circuit according to claim 12, wherein the resetting means includes a first transistors coupled to the primary signal line and a reset line and a second transistor coupled to the parallel signal line and the reset line, wherein activation of the reset line causes the first and second slave latches to drive a low-level logic signal.

15. The dividing circuit according to claim 14, wherein the resetting means further includes a self-reset driver cell.

16. The dividing circuit according to claim 15, wherein the self-reset driver cell includes an auxiliary master latch and a transistor tree.

17. The dividing circuit according to claim 12, wherein the feedback circuitry includes an inverter coupled to a feedback signal line, wherein the feedback signal line is coupled to a first of the plurality of bit slices.

18. The dividing circuit according to claim 12, wherein the plurality of cascaded bit slices are coupled together through a plurality of secondary bit output signal lines and a plurality of present state signal lines corresponding to the plurality of secondary bit output signal lines.

19. The dividing circuit according to claim 18, wherein the driving means includes a third slave latch having an input coupled to one of the plurality of present state signal lines and the parallel signal line and an output of the third slave latch being coupled to the feedback circuitry.

20. The dividing circuit according to claim 19, wherein the third slave latch drives a signal onto the feedback circuitry upon activation of the select line.

21. The dividing circuit according to claim 18, wherein the resetting means includes a first transistor coupled to the primary signal line and a reset line and a second transistor coupled to the parallel signal line and the reset line, wherein activation of the reset line causes the first and second slave latches to drive a low-level logic signal.

22. The dividing circuit according to claim 21, wherein the resetting means further includes a self-reset driver cell.

23. The dividing circuit according to claim 20, wherein the feedback circuitry includes a pair of feedback signal lines coupled to a multiplexor in which one of the pair of feedback lines is selected to output the output divider signal.

24. A dividing circuit for frequency synthesis of an input clock signal having a preselected frequency in order to obtain a divider output signal having a desired frequency, the dividing circuit comprising:

a first plurality of bit slices clocked by the input clock signal, the first plurality of bit slices are cascaded together through a second plurality of bit output signal lines where each of the second plurality of bit output signal lines couples an output of one bit slice to an input of an adjacent bit slice, the first plurality of bit slices further coupled together through a feedback circuit, wherein each of the first plurality of bit slices includes a master latch, a first slave latch coupled to the master latch through a primary signal line and one of the second plurality of bit output signal lines, a second slave latch coupled to the master latch through a parallel signal line and the feedback circuit, and a reset mechanism including a signal line coupled to a gate first transistor the primary signal line and the parallel signal line.

a reset mechanism including a reset line, a first transistor, wherein a drain of the first transistor is coupled to the parallel signal line, a source of the first transistor coupled to ground and a gate of the first transistor coupled to the reset line, and a second transistor, wherein a source of the second transistor is coupled to the voltage supply, a drain of the second transistor is coupled to the primary signal line and a gate of the second transistor coupled to the reset line.

25. The dividing circuit according to claim 24, wherein the reset mechanism further includes a self-reset driver cell.

26. The dividing circuit according to claim 24, wherein the first plurality of bit slices further includes a plurality of present state signal lines.

27. The dividing circuit according to claim 26, wherein the driving means further includes third slave latch having an input coupled to one of the plurality of present state signal lines and the parallel signal line and an output of the third slave latch being coupled to the feedback circuit.

28. A computer system comprising:
means for inputting information;
means for storing the information;
means for processing the information, the processing means, being able to perform frequency synthesis, includes
    means for providing dynamic feedback, the dynamic feedback means includes an internal oscillator generating an input clock signal having a preselected frequency; and
    means for dividing the input clock signal having a preselected frequency in order to provide a divider output signal having a desired frequency, said dividing means including
        counter means for generating a plurality of bit output signals in parallel;
        resetting means for re-initializing the plurality of bit output signals;
        multiplexor means for selecting one of the plurality of bit output signals; and
        feedback means for inputting the divider output signal into the counter means.

29. The dividing circuit according to claim 28, wherein the counter means includes a first plurality of flip-flops cascaded together, each output of the first plurality of flip-flops having a bit output signal line coupled thereto.

30. The dividing circuit according to claim 29, wherein each bit output signal line, when selected by the multiplexor means, represents a unique function of the preselected frequency.

31. The dividing circuit according to claim 29 wherein the counter means further includes logic means for generating the plurality of bit output signals, the logic means being coupled to the plurality of cascaded flip flops through the first plurality of bit output signal lines, the logic means is further coupled to the multiplexor means by a plurality of bit output signal lines corresponding to the plurality of bit output signals.

32. The dividing circuit according to claim 31, wherein each of the plurality of bit output signal lines, if selected, represents a frequency being an unique function of the preselected frequency, wherein a first bit output signal of the plurality of bit output signals represents a first frequency equal to the preselected frequency divided by "m", where "m" is an even number greater than or equal to one, and a second bit output signal of the plurality of bit output signals represents a second frequency equal to the preselected frequency divided by "p", where "p" is equal to an odd number greater than one.

33. The dividing circuit according to claim 32, wherein the multiplexor means includes a multiplexor having a plurality of channels corresponding to the plurality of bit output signals and an input means for selectively driving one of the plurality of channels receiving the divider output signal onto the feedback means.

34. The dividing circuit according to claim 33, wherein the feedback means includes a feedback signal line with an inverter, the feedback signal line being coupled to the counter means.

35. The dividing circuit according to claim 34, wherein the resetting means includes a first transistors coupled to the primary signal line and a reset line and a second transistor coupled to the parallel signal line and the reset line, wherein activation of the reset line causes the first and second slave latches to drive a low-level logic signal.

36. The dividing circuit according to claim 35, wherein the resetting means further includes a self-reset driver cell.

* * * * *

UNITED STATES PATENT AND TRADEMARK OFFICE
CERTIFICATE OF CORRECTION

PATENT NO. : 5,425,074
DATED : June 13, 1995
INVENTOR(S) : Keng L. Wong

It is certified that error appears in the above-indentified patent and that said Letters Patent is hereby corrected as shown below:

In column 4 at line 4 delete "nX∆A" and insert --nx∆--

In column 5 at line 37 delete "32" and insert --=--

In column 13 at line 52 insert --in order-- following "frequency" and before "to"

Signed and Sealed this

First Day of October, 1996

Attest:

BRUCE LEHMAN

Attesting Officer     Commissioner of Patents and Trademarks